(12) United States Patent
Yamaguchi

(10) Patent No.: US 9,261,551 B2
(45) Date of Patent: Feb. 16, 2016

(54) GROUND FAULT DETECTING DEVICE FOR AN UNGROUNDED CIRCUIT

(71) Applicant: HONDA MOTOR CO., LTD., Tokyo (JP)

(72) Inventor: Kazuhiko Yamaguchi, Saitama (JP)

(73) Assignee: HONDA MOTOR CO., LTD., Tokyo (JP)

( * ) Notice: Subject to any disclaimer, the term of this patent is extended or adjusted under 35 U.S.C. 154(b) by 436 days.

(21) Appl. No.: 13/936,756

(22) Filed: Jul. 8, 2013

(65) Prior Publication Data

US 2014/0008970 A1  Jan. 9, 2014

(30) Foreign Application Priority Data

Jul. 9, 2012  (JP) .................... 2012-153814

(51) Int. Cl.
- *B60L 3/00* (2006.01)
- *G01R 31/02* (2006.01)
- *B60L 3/04* (2006.01)
- *B60L 11/18* (2006.01)
- *B60L 15/00* (2006.01)

(52) U.S. Cl.
CPC ............ *G01R 31/024* (2013.01); *B60L 3/0046* (2013.01); *B60L 3/0069* (2013.01); *B60L 3/04* (2013.01); *B60L 11/1803* (2013.01); *B60L 15/007* (2013.01); *G01R 31/025* (2013.01); *B60L 2250/16* (2013.01)

(58) Field of Classification Search
None
See application file for complete search history.

(56) References Cited

U.S. PATENT DOCUMENTS

| | | | | |
|---|---|---|---|---|
| 6,984,988 B2* | 1/2006 | Yamamoto | ............ | B60L 3/0023 324/503 |
| 7,292,042 B2* | 11/2007 | Morita | .................. | B60L 3/0023 324/509 |
| 8,086,363 B2* | 12/2011 | Uchida | .................. | B60K 6/445 180/65.285 |
| 8,164,344 B2* | 4/2012 | Yano | ..................... | G01R 31/025 324/509 |
| 8,554,500 B2* | 10/2013 | Schumacher | ........ | G01R 31/025 702/182 |
| 8,618,809 B2* | 12/2013 | Schumacher | ........ | G01R 31/025 324/503 |
| 8,749,247 B2* | 6/2014 | Hara | ..................... | B60L 3/0023 324/509 |
| 8,791,702 B2* | 7/2014 | Miura | .................... | B60L 3/0069 320/134 |
| 8,878,543 B2* | 11/2014 | Morimoto | ............. | B60L 3/0069 324/503 |
| 9,041,413 B2* | 5/2015 | Naruse | .................. | B60L 3/0069 324/557 |
| 9,069,024 B2* | 6/2015 | Yang | ..................... | G01R 27/025 |

(Continued)

FOREIGN PATENT DOCUMENTS

JP  08-226950 A  9/1996

(Continued)

*Primary Examiner* — Rexford Barnie
*Assistant Examiner* — David Shiao
(74) *Attorney, Agent, or Firm* — Westerman, Hattori, Daniels & Adrian, LLP

(57) ABSTRACT

Provided is a ground fault detecting device 10 having a ground fault detection part 64 which detects a ground fault of an ungrounded circuit 70 based on a ground fault detection signal St_s of a ground fault signal detection circuit 53 when detection signals S_sig are superimposed on a positive side output part PL and a negative side output part ML by an inverting amplifier 25 connected to the positive side output part PL and an inverting amplifier 35 connected to the negative side output part ML, and having a power supply voltage detection part 66 which detects output voltage of a lithium-ion battery 71 based on a first power supply voltage detection signal Vd1_s of a first power supply voltage detection circuit 52.

8 Claims, 8 Drawing Sheets

(56) References Cited

U.S. PATENT DOCUMENTS

2009/0323233 A1* 12/2009 Shoemaker ............ B60L 3/0069 361/42
2015/0168474 A1* 6/2015 Yoshioka ............. G01R 31/025 702/58

FOREIGN PATENT DOCUMENTS

| JP | 2933490 B2 | 8/1999 |
| JP | 3590679 A | 11/2004 |
| JP | 2009-150779 A | 7/2009 |

* cited by examiner

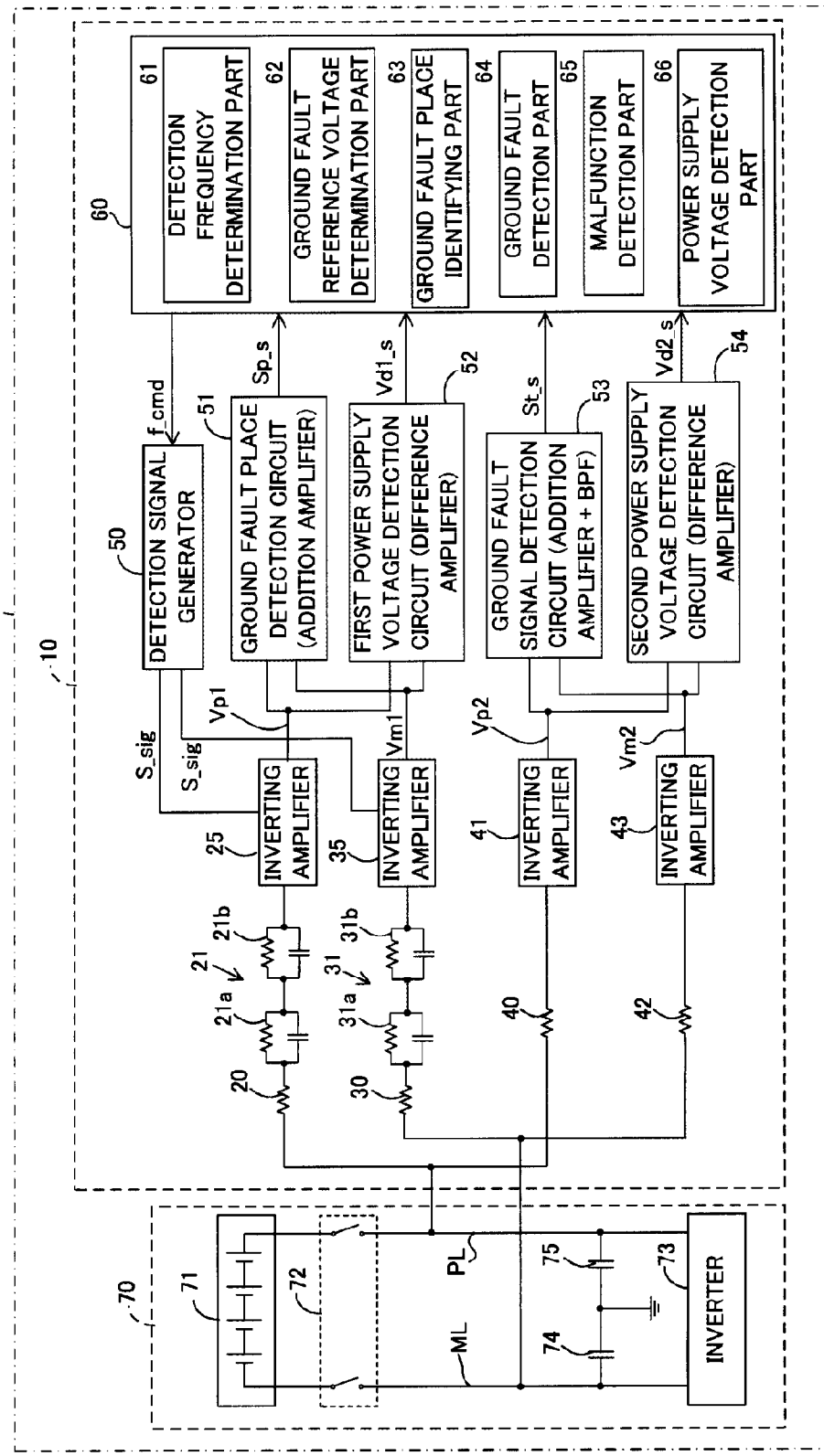

[GROUND FAULT SIGNAL DETECTION CIRCUIT]

[FIRST POWER SUPPLY VOLTAGE DETECTION CIRCUIT]

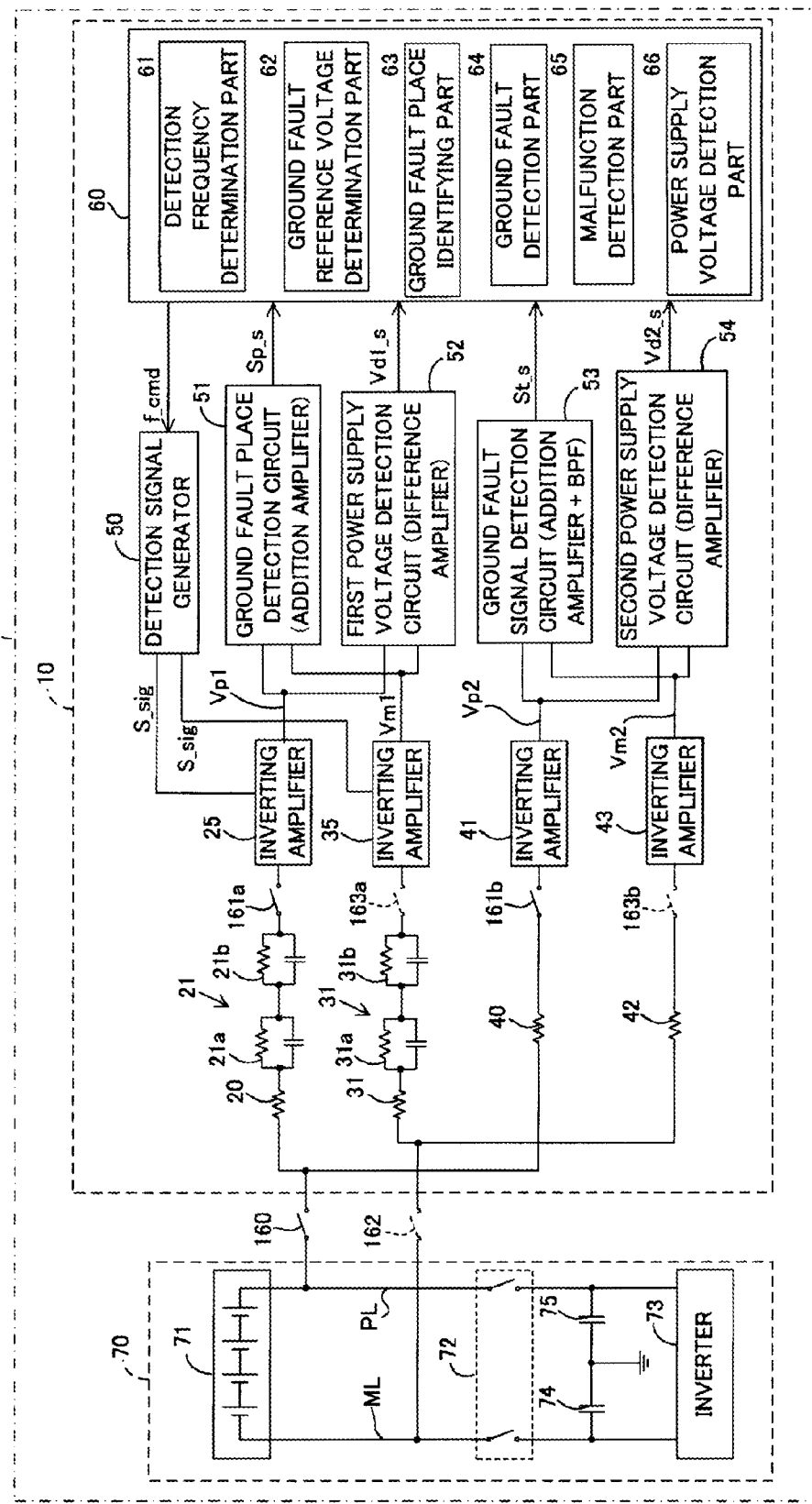

GROUND FAULT DETECTING DEVICE FOR AN UNGROUNDED CIRCUIT

BACKGROUND OF THE INVENTION

1. Field of the Invention

The present invention relates to a ground fault detecting device for detecting ground fault of an ungrounded circuit installed in an electric vehicle or the like.

2. Description of the Related Art

In an electric vehicle (battery-powered vehicle, hybrid vehicle, fuel cell vehicle, or the like) including a direct-current power source which outputs high voltage, it is general to arrange the direct-current power source and a circuit connected to the direct-current power source as an ungrounded circuit insulated from a ground potential section of the vehicle body.

There has been conventionally proposed various configurations to detect ground fault in which the insulation of the ungrounded circuit arranged as such in the electric vehicle and the ground potential section of the vehicle body has lowered (a state of a resistance between the ungrounded circuit and the ground potential section of the vehicle is reduced close to 0 Ω) (for example, refer to Patent Document 1: Japanese Patent Application Laid-Open No. H08-226950, Patent Document 2: Japanese Patent No. 2933490, Patent Document 3: Japanese Patent Application Laid-Open No. 2009-150779, Patent Document 4: Japanese Patent No. 3590679).

In the configurations disclosed in the Patent Documents 1 to 3, since it is not able to detect a power supply voltage of the ungrounded circuit, it is necessary to prepare a voltage detector separate from a ground fault detector. Therefore, there is an inconvenience that the size of the ground fault detecting device increases when it is configured to perform ground fault detection and power supply voltage detection.

Furthermore, the configuration disclosed in Patent Document 4 divides the power supply voltage and applies output voltage of a reference power source to an intermediate potential, and detects ground fault based on flow of current from the reference power source to a ground fault resistance. According to this configuration, there is an inconvenience that ground fault cannot be detected since current does not flow when ground fault occurs with the same electric potential as the output voltage of the reference power source.

SUMMARY OF THE INVENTION

The present invention has been made in view of such background, and it is an object of the present invention to provide a ground fault detecting device capable of detecting ground fault of an ungrounded circuit and detecting power supply voltage of the ungrounded circuit at the same time, and also capable of detecting ground fault irrespective of ground fault potential by a configuration which enables downsize of the device.

The present invention is aimed to achieve the above object and is related to a ground fault detecting device of an ungrounded circuit which detects ground fault of the ungrounded circuit having a direct-current power supply and arranged in a vehicle electrically insulated from a ground potential portion of a vehicle body.

The ground fault detecting device of the ungrounded circuit of the present invention, comprises:

a detection signal generator configured to output detection signals in which an output voltage changes at a predetermined detection frequency;

a first amplifier connected to a positive side output part of the direct-current power supply via a first junction circuit in which a capacitor and a resistance are connected in parallel, and configured to superimpose the detection signals to the positive side output part via the first junction circuit, and to output voltage according to voltage of the positive side output part based on voltage which is input via the first junction circuit;

a second amplifier connected to a negative side output part of the direct-current power supply via a second junction circuit in which a capacitor and a residence are connected in parallel, and configured to superimpose the detection signals to the negative side output part via the second junction circuit, and to output voltage according to voltage of the negative side output part based on voltage which is input via the second junction circuit;

a ground fault detection part configured to detect ground fault of the ungrounded circuit based on a fluctuation range between voltage of the positive side output part and voltage of negative side output part when the detection signals are superimposed on the positive side output part and the negative side output part of the direct-current power supply by the first amplifier and the second amplifier; and a first power supply voltage detection part configured to detect output voltage of the direct-current power supply based on a difference of output voltage of the first amplifier and the second amplifier (first aspect of the invention).

According to the first aspect of the invention it is able to detect the output voltage of the direct-current power supply based on the difference between the output voltage of the first amplifier and the second amplifier by the first power supply voltage detection part, when the detection signals are superimposed on the positive side output part and the negative side output part of the direct-current power supply by the first amplifier and the second amplifier, and the ground fault of the ungrounded circuit is being detected by the ground fault detection part. Therefore, the increase of exclusive parts necessary to detect the output voltage of the direct-current power supply can be suppressed, thereby enabling to downsize the ground fault detecting device. Furthermore, in the first aspect of the invention, since direct-current voltage is not applied when detecting ground fault, there are no cases where it is unable to detect ground fault due to the ground fault potential like the configuration disclosed in above Patent Document 4.

It is preferable in the first aspect of the invention that the first junction circuit and the second junction circuit are configured by connecting a plurality of unit junction circuits in series, each of the unit junction circuits having a capacitor and a resistance connected in parallel (second aspect of the invention).

According to the second aspect of the invention, the first junction circuit and the second junction circuit are configured by connecting in series a plurality of numbers of unit junction circuits. Therefore, it is able to enlarge the total capacity by using low-voltage capacitors as the capacitor configuring each unit junction circuit. Therefore, for example, it is able to downsize the ground fault detecting device by using a low-voltage, high-capacity, and small-sized ceramic capacitor. Furthermore, by increasing and decreasing the number of unit junction circuits connected in series, it is able to easily set a voltage-dividing level of the output voltage of the direct-current power supply by the first junction circuit and the second junction circuit.

It is preferable in the first aspect and the second aspect of the invention to comprise, a second power supply voltage detection part configured to detect output voltage of the direct-current power supply based on a difference between voltage of the positive side output part and voltage of the negative side output part of the direct-current power supply, and a malfunction detection part configured to detect malfunction of the ground fault detecting device by comparing output voltage of the direct-current power supply detected by the first power supply voltage detection part and output voltage of the direct-current power supply detected by the second power supply voltage detection part (third aspect of the invention).

According to the third aspect of the invention, if one of or both of the first amplifier and the second amplifier fails, the output voltage of the direct-current power supply detected by the first power supply voltage detection part becomes abnormal, and becomes a state different from the output voltage of the direct-current power supply detected by the second power supply voltage detection part. Therefore, the malfunction detection part can detect the failure of the ground fault detecting device by comparing the output voltage of the direct-current power supply detected by the first power supply voltage detection part and the output voltage of the direct-current power supply detected by the second power supply voltage detection part.

It is preferable in any one of the first aspect through the third aspect of the invention to comprise a ground fault place identifying part configured to identify a place of the ground fault of the ungrounded circuit based on output voltage of the first amplifier and the second amplifier (fourth aspect of the invention).

According to the fourth aspect of the invention, when ground fault occurs at the positive side output part of the direct-current power supply, the fluctuation range of the output voltage of the first amplifier according to the superimposing of the detection signals decreases. When ground fault occurs at the negative side output part of the direct-current power supply, the fluctuation range of the output voltage of the second amplifier according to the superimposing of the detection signals decreases. Therefore, the ground fault place identifying part is able to identify the place of ground fault of the ungrounded circuit based on the output voltage of the first amplifier and the second amplifier.

It is preferable in any one of the first aspect through the fourth aspect of the invention to comprise, a ground fault reference voltage determination part configured to situate a state of superimposing the detection signals to the positive side output part of the direct-current power supply from the first amplifier and superimposing direct-current voltage to the negative side output part of the direct-current power supply from the second amplifier, or a state of superimposing the detection signals to the negative side output part of the direct-current power supply from the second amplifier and superimposing direct-current voltage to the positive side output part of the direct-current power supply from the first amplifier, configured to measure a fluctuation range of voltage of the positive side output part and voltage of the negative side output part of the direct-current power supply, and configured to determine a ground fault reference voltage based on the fluctuation range, wherein the ground fault detection part is configured to detect existence or non-existence of ground fault of the ungrounded circuit by comparing the ground fault reference voltage and a measured voltage according to voltage fluctuation range of the positive side output part and voltage fluctuation range of the negative side output part, when the detection signals are superimposed on the positive side output part and the negative side output part of the direct-current power supply by the first amplifier and the second amplifier (fifth aspect of the invention).

According to the fifth aspect of the invention, by situating to superimpose the detection signals from only one of the first amplifier and the second amplifier, and to superimpose direct-current voltage from the other, it is able to make a same state as the positive side output part or the negative side output part of the direct-current power supply has short-circuited. And the fluctuation range of voltage of the positive side output part and the negative side output part of the direct-current power supply in this state becomes the same level as when the positive side output part or the negative side output part of the direct-current power supply is short-circuited. Therefore, the ground fault reference voltage determination part is able to determine the appropriate ground fault reference voltage in which an influence of Y capacitors or the like connected to the direct-current power supply is reduced, based on the voltage fluctuation range of the positive side output part and the negative side output part of the direct-current power supply in this state. Therefore, the ground fault detection part is able to easily detect existence or non-existence of ground fault of the ungrounded circuit by using the ground fault reference voltage.

It is preferable in the first aspect of the invention to comprise, a band-pass filter configured to pass only signals having frequency within a predetermined frequency band including the detection frequency among signals superimposed on output voltage of the direct-current power supply, and input them to the ground fault detection part, wherein the ground fault detection part is configured to measure a fluctuation range of the positive side output part and the negative side output part of the direct-current power supply from output voltage of the band-pass filter (sixth aspect of the invention).

According to the sixth aspect of the invention, it is able to cut high frequency noise signals superimposed to the output voltage of the direct-current power supply by the band-pass filter, thereby enabling to measure the fluctuation range of the positive side output part and the negative side output part of the direct-current power supply with high accuracy.

It is preferable in the sixth aspect of the invention to comprise a detection frequency determination part configured to determine as the detection frequency, a frequency in which amplitude of voltage output to the ground fault detection part from the band-pass filter is maximum in a middle portion of the predetermined frequency band, by changing the frequency of the detection signals while measuring amplitude of voltage input to the ground fault detection part from the band-pass filter (seventh aspect of the invention).

According to the seventh aspect of the invention, the predetermined frequency band of the band-pass filter changes according to the actual performance value of components (resistance, capacitor, or the like) composing the band-pass filter. Therefore, by executing the process by the detection frequency determination part, and coordinating the detection frequency in the middle portion of the frequency band of the band-pass filter, it is able to enhance the effect of the band-pass filter.

Moreover, the vehicle of the present invention includes the ground fault detecting device of the ungrounded circuit according to the first aspect of the invention (eighth aspect of the invention).

According to the eighth aspect of the invention, it is able to perform ground fault detection of ungrounded circuit and output voltage detection of the direct-current power supply in the vehicle by a downsized ground fault detecting device.

BRIEF DESCRIPTION OF THE DRAWINGS

FIG. 1 is a configuration diagram of a ground fault detecting device of an ungrounded circuit.

FIG. 8 is an explanatory diagram of a configuration of the ground fault detecting device connected to the ungrounded circuit without the intermediary of a contactor.

DESCRIPTION OF THE PREFERRED EMBODIMENTS

Figure 2A:
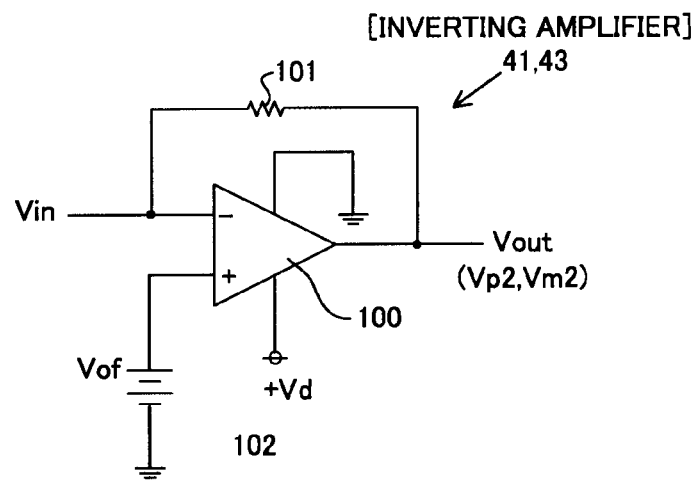
FIG. 2A and FIG. 2B are configuration diagrams of an inverting amplifier.

The following describes an example of an embodiment of a ground fault detecting device of an ungrounded circuit of the present invention with reference to FIG. 1 to FIG. 7.

Referring to FIG. 1, a ground fault detecting device 10 of an ungrounded circuit of the present embodiment is installed in an electric vehicle 1 (which corresponds to a vehicle of the present invention such as a battery driven vehicle, a hybrid vehicle, a fuel cell vehicle or the like), and detects an existence or non-existence of a ground fault of an ungrounded circuit 70 included in the electric vehicle 1.

The ungrounded circuit 70 includes a lithium-ion battery 71 (corresponds to a direct-current power supply of the present invention) and an inverter 73 connected to the lithium-ion battery 71 via a contactor 72. The inverter 73 is connected to a driving electric motor (not illustrated) of the electric vehicle 1, and generates three-phase driving voltage from output voltage of the lithium-ion battery 71, and outputs to the driving electric motor.

The output voltage of the lithium-ion battery 71 is high, for example 300V, and the ungrounded circuit 70 composed of the lithium-ion battery 71 and a circuit connected to the lithium-ion battery 71 is arranged electrically insulated from a ground potential part (body earth) of a vehicle body of the electric vehicle 1.

The ground fault detecting device 10 is connected to a positive side output part PL and a negative side output part ML of the lithium-ion battery 71, and detects the existence or non-existence of ground fault of the positive side output part PL and the negative side output part ML. The ground fault detecting device 10 includes an inverting amplifier 25 (which corresponds to a first amplifier of the present invention) connected to the positive side output part PL via a resistance 20 and a first junction circuit 21, an inverting amplifier 35 (which corresponds to a second amplifier of the present invention) connected to the negative side output part ML via a resistance 30 and a second junction circuit 31, an inverting amplifier 41 connected to the positive side output part PL via a resistance 40, an inverting amplifier 43 connected to the negative side output part ML via a resistance 42, and a detection signal generator 50. The resistances 20, 30, 40, 42 are of high-resistance, for example, approximately several 100 k Ω to several 10 M Ω.

The first junction circuit 21 is configured by series-connecting unit junction circuits 21a, 21b in which a resistance and a capacitor are connected in parallel. The first junction circuit 21 divides the voltage of the positive side output part PL by the resistance 20, resistance of the first junction circuit 21, and internal resistance (resistance 111 of FIG. 2B) of the inverting amplifier 25, and inputs to the inverting amplifier 25, and also superimposes detection signals S_sig output from the detection signal generator 50 on to the positive side output part PL via the capacitors of the unit junction circuits 21a, 21b.

Similarly, the second junction circuit 31 is configured by series-connecting unit junction circuits 31a, 31b in which a resistance and a capacitor are connected in parallel. The second junction circuit 31 divides the voltage of the negative side output part ML by the resistance 30, resistance of the second junction circuit 31, and internal resistance (resistance 111 of FIG. 2B) of the inverting amplifier 35, and inputs to the inverting amplifier 35, and also superimposes detection signals S_sig output from the detection signal generator 50 on to the negative side output part ML via the capacitors of the unit junction circuits 31a, 31b.

As is illustrated in FIG. 2A, the inverting amplifiers 41, 43 are configured to connect between a negative input terminal and an output terminal of an operational amplifier 100 via a resistance 101, and are also input of offset voltage Vof. The offset voltage Vof is, for example, set to Vb=2.5V with respect to power supply voltage Vd=5V of the operational amplifier 100.

Figure 2B:
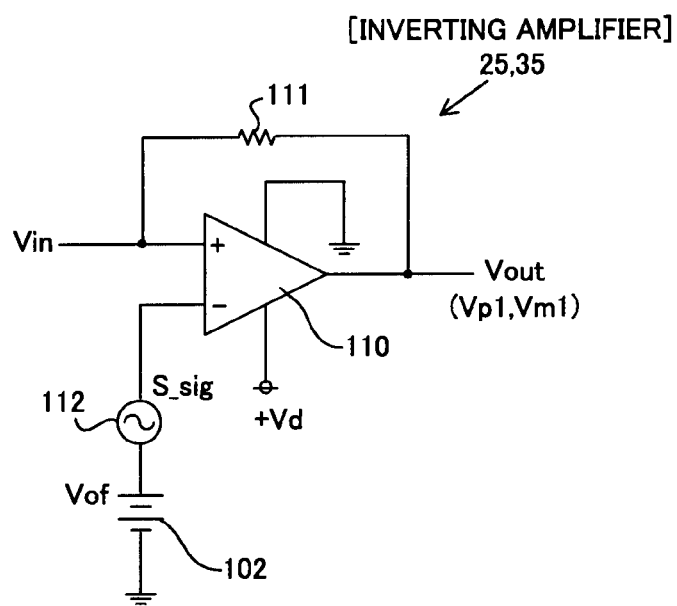

Furthermore, as is illustrated in FIG. 2B, the inverting amplifiers 25, 35 are configured to connect between a negative input terminal and an output terminal of an operational amplifier 110 via the resistance 111, and are also input of offset voltage Vof with the detection signals S_sig from the detection signal generator 50 superimposed thereon. According to this configuration, at a positive input terminal of the operational amplifier 110, detection signals S_sig having a voltage which periodically changes with the Vof as the center, are superimposed. Square-wave, sign-wave, or the like can be used as detection signals S_sig.

Moreover, at the inverting amplifier 25, the detection signals S_sig are superimposed on the positive side output part PL of the lithium-ion battery 71 via the first junction circuit 21, and at the inverting amplifier 35, the detection signals S_sig are superimposed on the negative side output part ML of the lithium-ion battery 71 via the second junction circuit 31.

Moreover, the ground fault detecting device 10 includes a ground fault place detection circuit 51 which outputs ground fault place detection signals Sp_s for detecting ground fault place by adding output voltage Vp1 of the inverting amplifier 25 and output voltage Vm1 of the inverting amplifier 35, a first power supply voltage detection circuit 52 which outputs first power supply voltage detection signals Vd1_s for detecting output voltage of the lithium-ion battery 71 by calculating the difference between output voltage Vp1 of the inverting amplifier 25 and output voltage Vrnl of the inverting amplifier 35, a ground fault signal detection circuit 53 which outputs ground fault detection signals St_s for determining the existence or non-existence of ground fault by adding output voltage Vp2 of the inverting amplifier 41 and output voltage Vm2 of the inverting amplifier 43, a second power supply voltage detection circuit 54 which outputs second power supply voltage detection signals Vd2_s for detecting output voltage of the lithium-ion battery 71 by calculating the difference between output voltage Vp2 of the inverting amplifier 41 and output voltage Vm2 of the inverting amplifier 43, and a controller 60 for executing various processing of the ground fault detecting device 10.

Figure 3A:
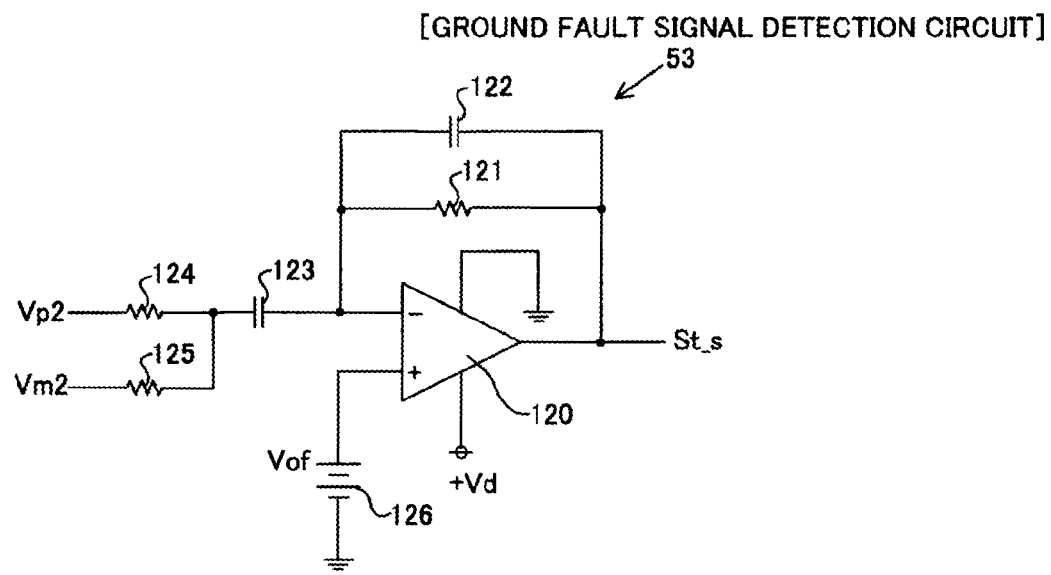
FIG. 3A is a configuration diagram of a ground fault signal detection circuit.

As is illustrated in FIG. 3A, the ground fault signal detection circuit 53 is configured to have a function of a band-pass filter (BPF) by connecting in parallel a resistance 121 and a capacitor 122 between a negative input terminal and an output terminal of an operational amplifier 120, and to connect a resistance 124, 125 to the negative input terminal of the operational amplifier 120 via a capacitor 123 (coupling capacitor), and to add the output voltage Vp2 of the inverting amplifier 41 and the output voltage Vm2 of the inverting amplifier 43. Moreover, offset voltage Vof is input to a positive input terminal of the operational amplifier 120.

According to this configuration, only a component which is added with the signals superimposed on the positive side output part PL and the signals superimposed on the negative side output part ML of the lithium-ion battery 71 is input to the operational amplifier 120 via the capacitor 122. Among such component, only signals within a transmission frequency band of the band-pass filter are output from the operational amplifier 120 as the ground fault detection signal St_s.

Figure 3B:
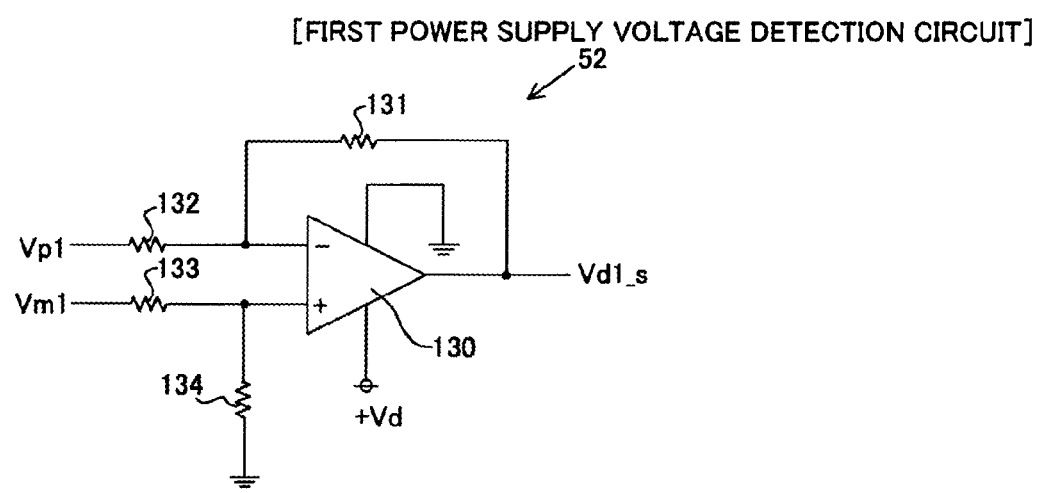
FIG. 3B is a configuration diagram of a first power supply voltage detection circuit.

As is illustrated in FIG. 3B, the first power supply voltage detection circuit 52 is configured to connect between a negative input terminal and output terminal of an operational amplifier 130 via a resistance 131, and also to input the output voltage Vp1 of the inverting amplifier 25 to the negative input terminal via a resistance 132. Moreover, it is configured to connect a positive input terminal of the operational amplifier 130 to the ground potential part via a resistance 134, and also to input the output voltage Vm1 of the inverting amplifier 35 to the positive input terminal via a resistance 133.

According to this configuration, the difference between the output voltage Vp1 of the inverting amplifier 25 and the output voltage Vm1 of the inverting amplifier 35 is output from the operational amplifier 130 as the first power supply voltage detection signal Vd1_s.

Figure 4:
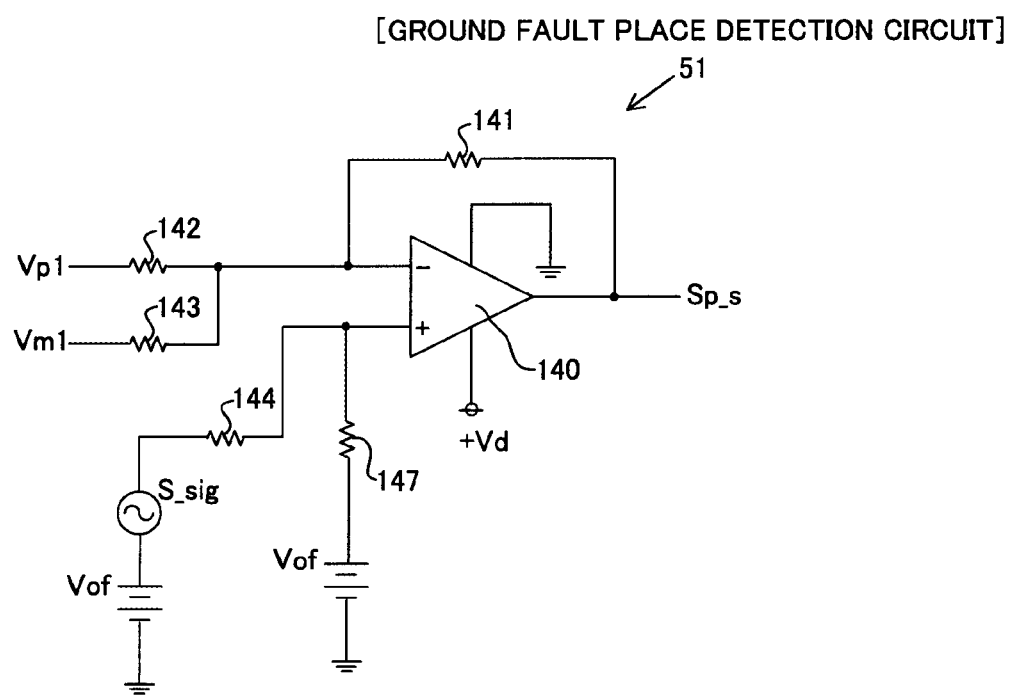
FIG. 4 is a configuration diagram of a ground fault place detection circuit .

Furthermore, as is illustrated in FIG. 4, the ground fault place detection circuit 51 is configured to connect between a negative input terminal and an output terminal of an operational amplifier 140 via a resistance 141, and to input the output voltage Vp1 of the inverting amplifier 25 to the negative input terminal via a resistance 142, and also to input the output voltage Vm1 of the inverting amplifier 35 to the negative input terminal via a resistance 143.

Moreover, the ground fault place detection circuit 51 is configured to input the detection signals S_sig added with the offset voltage Vof to a positive input terminal of the operational amplifier 140 via a resistance 144, and also to input offset voltage Vof to the positive input terminal via a resistance 147.

According to this configuration, the ground fault place detection circuit 51 outputs ground fault place detection signals Sp_s which changes its amplitude according to the ground fault place (the positive side output part PL or the negative side output part ML).

Next, the controller 60 is composed of a CPU, memory, or the like which are not shown in the figures. By executing control programs of the ground fault detecting device 10 stored in the memory, the controller 60 functions as a detection frequency determination part 61, a ground fault reference voltage determination part 62, a ground fault place identifying part 63, a ground fault detection part 64, a malfunction detection part 65, and a power supply voltage detection part 66.

The controller 60 is input with the ground fault place detection signal Sp_s from the ground fault place detection circuit 51, the first power supply voltage detection signal Vd1_s from the first power supply voltage detection circuit 52, the ground fault detection signal St_s from the ground fault detection circuit 53, and the second power supply voltage detection signal Vd2_s from the second power supply voltage detection circuit 54. Moreover, the frequency of the detection signals S_sig is changed by a frequency command signal f_cmd output to the detection signal generator 50 from the controller 60.

The first power supply voltage detection circuit 52 and the configuration of the power supply voltage detection part 66 detecting the output voltage of the lithium-ion battery 71 based on the first power supply voltage detection signal Vd1_s constitute the first power supply voltage detection part of the present invention. Furthermore, the second power supply voltage detection circuit 54 and the configuration of the power supply voltage detection part 66 detecting the output voltage of the lithium-ion battery 71 based on the second power supply voltage detection signal Vd2_s constitute the second power supply voltage detection part of the present invention.

In the present embodiment, as is illustrated in FIG. 1, the first junction circuit 21 is configured by connecting two unit junction circuits 21a and 21b in series, and the second junction circuit 31 is configured by connecting two unit junction circuits 31a and 31b in series. However, the first junction circuit 21 and the second junction circuit 31 may be configured by connecting more than three unit junction circuits 150 in series as is shown in FIG. 5A.

Figure 5A:
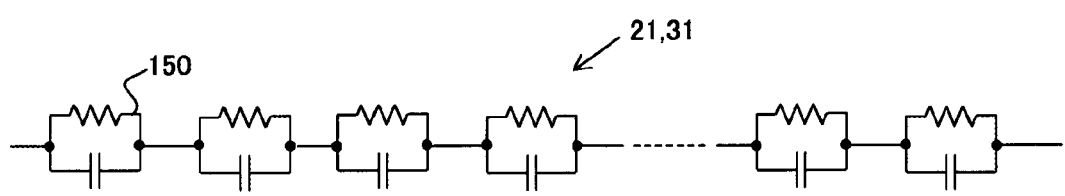
FIG. 5A is an explanatory diagram of another embodiment of a first junction circuit.
Figure 5B:
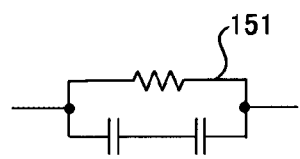
FIG. 5B is an explanatory diagram of another embodiment of a second junction circuit.

According to the configuration shown in FIG. 5A, by increasing the number of unit junction circuits 150 connected, it is able to decrease the voltage applied to each unit junction circuit 150. Therefore, it is able to configure the unit junction circuit 150 by using low voltage and high capacity capacitor, while increasing the capacity of the first junction circuit 21 and the second junction circuit 31 in total. Moreover, as is shown in FIG. 5B, the unit junction circuit 151 may be configured by a plurality of capacitors connected in series (two in FIG. 5B) and a resistance being connected in parallel.

Figure 6:
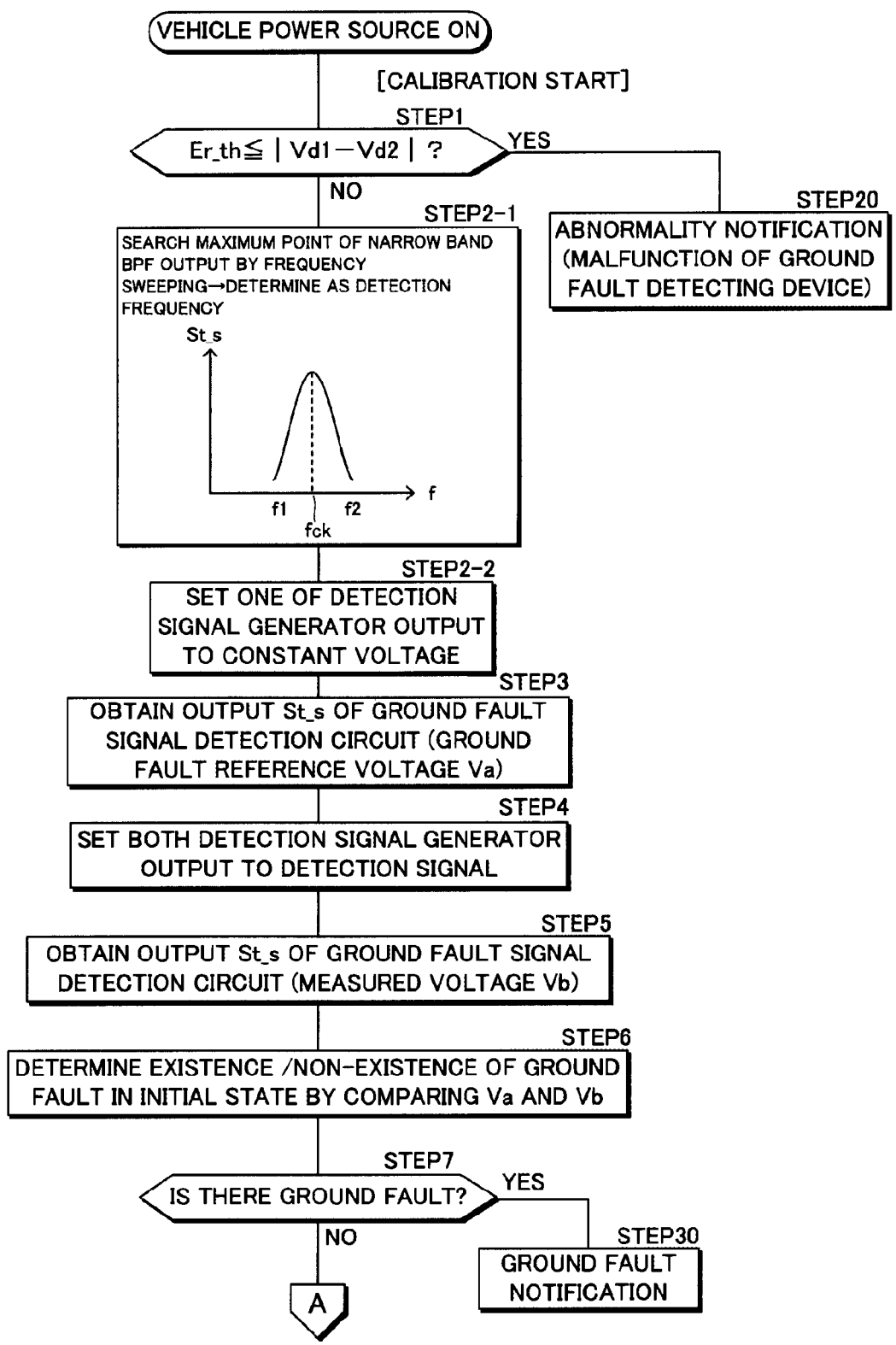
FIG. 6 is a flow chart of calibration processing by a controller.
Figure 7:
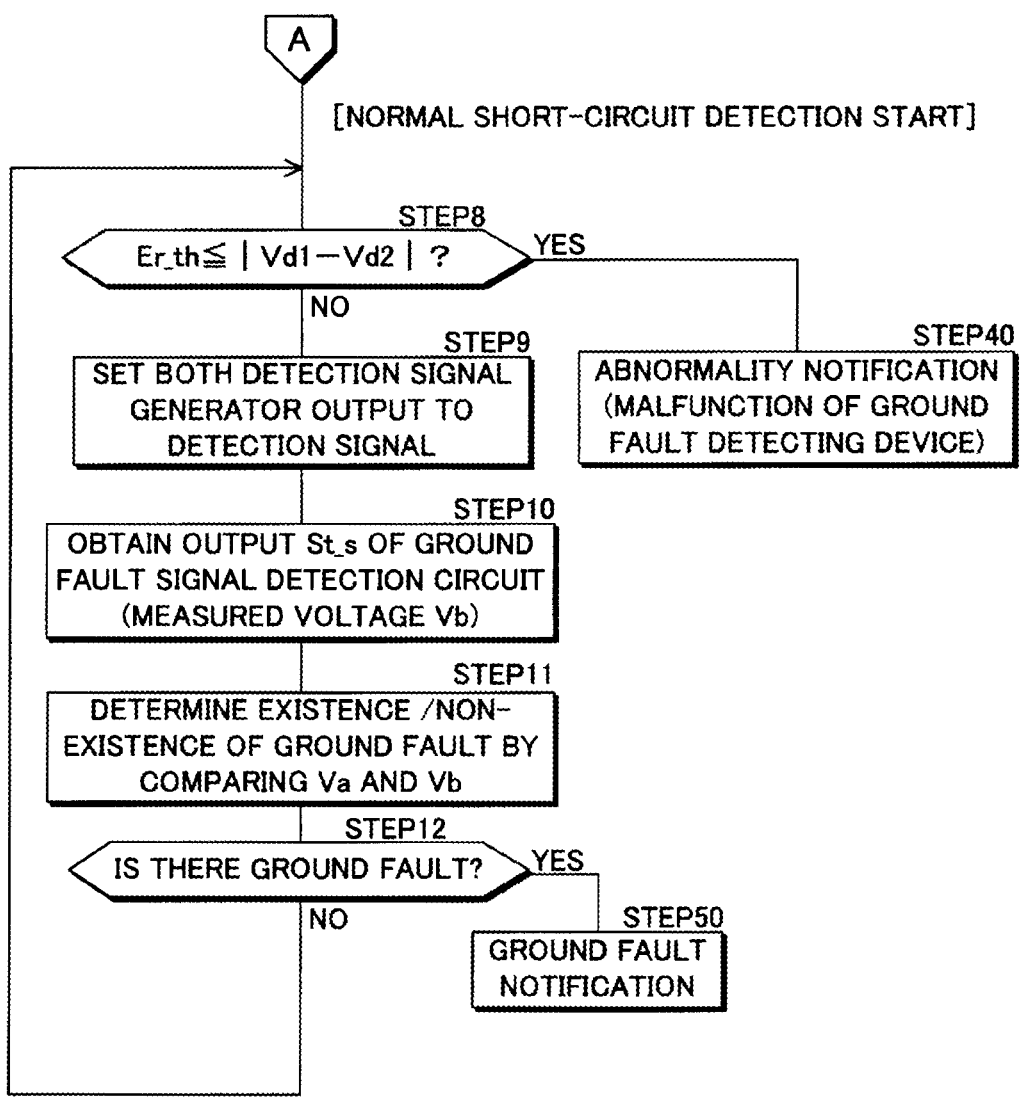
FIG. 7 is a flow chart of an usual short circuit detection processing by the controller.

Next, according to the flowchart shown in FIG. 6 and FIG. 7, the ground fault detection processing of the ungrounded circuit 70 by the controller 60 is explained.

STEP 1 to STEP 7 of FIG. 6 is a calibration processing which is performed when the power source of the electric vehicle 1 is ON and the contactor 72 (refer to FIG. 1) is turned ON (conduction state).

STEP 1 is a processing by the malfunction detection part 65. The malfunction detection part 65 determines whether or not the difference between the output voltage Vd1 of the lithium-ion battery 71 recognized from the first power supply voltage detection signal Vd1_s by the power supply voltage detection part 66 and the output voltage Vd2 of the lithium-ion battery 71 recognized from the second power supply voltage detection signal Vd2_s by the power supply voltage detection part 66 is equal to or more than a predetermined abnormal detection threshold value Er_th (Er_≤|Vd1-Vd2|).

When the difference between Vd1 and Vd2, where Vd1 and Vd2 should be approximately the same if abnormity of the ground fault detecting device 10 has not occurred, becomes equal to or more than the abnormal detection threshold value Er_th, the processing branches to STEP 20. In STEP 20, the malfunction detection part 65 shows the abnormality on a display (not illustrated) as abnormal notification, and also outputs abnormal notification audio from a speaker (not illustrated), and then terminates the processing.

On the other hand, when the difference between Vd1 and Vd2 is less than the abnormal detection threshold value Er_th, the processing proceeds to STEP 2. STEP 2 is a processing by the detection frequency determination part 61. The detection frequency determination part 61 sweeps the frequency of the detection signals S_sig in the range of designed value f1 to f2 of the transmission frequency band (which corresponds to the predetermined frequency band of the present invention) of the band-pass filter (refer to FIG. 3A) of the ground fault signal detection circuit 53. Then, the detection frequency determination part 61 searches for the frequency which the ground fault detection signal St_s output from the ground fault signal detection circuit 53 is maximum.

The detection frequency determination part 61 determines the frequency which the ground fault detection signal St_s is maximum as the detection frequency f_ck. By sweeping the frequency of the detection signals S_sig and determining the detection frequency f_ck as above, it is able to determine the intermediate frequency in the transmission frequency band of the band-pass filter of the ground fault signal detection circuit 53 as the detection frequency f_ck. Therefore, it is able to enhance the effect of removing the signals other than the detection signals S_sig by the band-pass filter.

The subsequent STEP 2 to STEP 3 are processing by the ground fault reference voltage determination part 62. In STEP 2, the ground fault reference voltage determination part 62 makes a state in which detection signal is output only to the inverting amplifier 25 from the detection signal generator 50 by a frequency command signal f_cmd, and direct-current voltage (for example, offset voltage Vof or the like) is output to the inverting amplifier 35.

In this state, detection signals S_sig are superimposed only on the positive side output part PL of the lithium-ion battery 71 and detection signal is not superimposed on the negative side output part ML. Therefore, the amplitude of the ground fault detection signal St_s output from the ground fault signal detection circuit 53 becomes half of the amplitude when the detection signals S_sig are superimposed on both of the positive side output part PL and the negative side output part ML of the lithium-ion battery 71.

Then, in STEP 3, the ground fault reference voltage determination part 62 obtains the amplitude of the ground fault detection signal St_s output from the ground fault signal detection circuit 53 in this state as ground fault reference voltage Va. By this, it is able to obtain the ground fault reference voltage Va including the influence of current flowing into the Y capacitor 75 (refer to FIG. 1) connected between the positive side output part PL of the lithium-ion battery 71 and the ground fault potential and into the Y capacitor 74 connected between the negative side output part ML of the lithium-ion battery 71 and the ground fault potential.

Here, the ground fault reference voltage Va may be obtained in a state in which the detection signals S_sig are superimposed only on the negative side output part ML of the lithium-ion battery 71 and the detection signals S_sig are not super imposed on the positive side output part PL.

The next steps of STEP 4 to STEP 6 are processing by the ground fault detection part 64. In STEP 4, the ground fault detection part 64 inputs detection signals S_sig having the detection frequency f_ck to both of inverting amplifiers 25 and 35 from the detection signal generator 50 by the frequency command signal f_cmd. The ground fault signal detection circuit 53 and the ground fault detection part 64 configure the ground fault detection part of the present invention.

In the following STEP 5, the ground fault detection part 64 obtains the ground fault detection signal St_s output from the ground fault signal detection circuit 53 as a measured voltage Vb. Then, in the next STEP 6, the ground fault detection part 64 compares the measured voltage Vb and the ground fault reference voltage Va, and determines that there is a ground fault when the amplitude of the measured voltage Vb (which is in accordance with the fluctuation range of the voltage of the positive side output PL and the fluctuation range of the negative side output part ML) is equal to or less than a certain constant ratio with respect to the ground fault reference voltage Va.

When it is determined that there is a ground fault, the processing branches to STEP 30 at the next STEP 7, and the ground fault detection part 64 executes ground fault notification (indicate ground fault occurrence on the display, output ground fault occurrence audio from the speaker, or the like), and then terminates the processing. On the other hand, if it is determined that there is no ground fault, STEP 7 proceeds to STEP 8 of FIG. 7. The controller 60 repeatedly performs the normal processing of short-circuit detection of STEP 8 to STEP 12 when the power source of the electric vehicle 1 is ON.

STEP 8 is a processing by the malfunction detection part 65. Similar to STEP 1 of FIG. 6, the malfunction detection part 65 determines whether or not the difference between the output voltage Vd1 of the lithium-ion battery 71 recognized from the first power supply voltage detection signal Vd1_s by the power supply voltage detection part 66 and the output voltage Vd2 of the lithium-ion battery 71 recognized from the second power supply voltage detection signal Vd2_s by the power supply voltage detection part 66, is equal to or more than an abnormal detection threshold value Er_th (Er_th≤|Vd1-Vd2|).

When the difference between Vd1 and Vd2 becomes equal to or more than the abnormal detection threshold value Er_th, the processing branches to STEP 40, and the malfunction detection part 65 displays the abnormality on a display as abnormal notification, and also outputs abnormal notification audio from a speaker, and then terminates the processing.

The next steps of STEP 9 to STEP 12 and STEP 50 branching from STEP 12 are processing by the ground fault detection part 64. In STEP 9, detection signals S_sig having the detection frequency f_ck are input to both of the inverting amplifiers 25 and 35 from the detection signal generator 50 by the frequency command signal f_cmd. In STEP 10, the ground fault detection part 64 obtains the ground fault detection signal St_s output from the ground fault signal detection circuit 53 as the measured voltage Vb.

Then, in the next STEP 11, the ground fault detection part 64 compares the measured voltage Vb and the ground fault reference voltage Va (compares the amplitudes thereof), and determines that there is a ground fault when the measured voltage Vb is equal to or less than a certain constant ratio with respect to the ground fault reference voltage Va.

When it is determined that there is a ground fault, the ground fault detection part 64 branches to STEP 50 at the next STEP 12, and executes ground fault notification (indicate ground fault occurrence on the display, output ground fault occurrence audio from the speaker, or the like), and then terminates the processing. On the other hand, if it is determined that there is no ground fault, the processing returns to STEP 8, and the ground fault detection part 64 performs the processing after STEP 8 again.

As is illustrated in FIG. 1, the ground fault detecting device 10 of the present embodiment is disconnected from the lithium-ion battery 71 by the contactor 72 of the ungrounded circuit 70 when the power source of the electric vehicle 1 is OFF. Therefore, when the power source of the electric vehicle 1 is OFF, current does not flow to the ground fault detecting device 10 from the lithium-ion battery 71.

In contrast, as is shown in FIG. 8, when the ground fault detecting device 10 is directly connected to the lithium-ion battery 71 without the intermediary of the contactor 72, it becomes a state in which leakage current flows to the ground fault detecting device 10 from the lithium-ion battery 71 even when the power source of the electric vehicle 1 is OFF. As such, in order to avoid such leakage current, it is preferable to provide a switch 160 (in a case of disconnecting at one place) or switches 161*a*, 161*b* (in a case of disconnecting at two places) to interrupt the energizing path between lithium-ion battery 71 and the ground fault detecting device 10.

As a modified embodiment of FIG. 8, a switch 162 may be provided to the connecting path of the negative side output part ML of the lithium-ion battery 71 and the ground fault detecting device 10 instead of the switch 160, and it is also acceptable to provide both switches 160 and 162. Moreover, the switches 163*a* and 163*b* may be provided to the connecting path on the negative side instead of the switches 161*a* and 161*b*, and it is also acceptable to provide both of the switches 161*a*, 161*b* and the switches 163*a*, 163*b*.

As the switches 160, 161*a*, 161*b*, 162, 163*a*, 163*b*, a relay, MOSFET, photomos switch, or the like may be used.

In the present embodiment, the second power supply voltage detection circuit 54 is provided and included a feature to detect malfunction of the ground fault detecting device 10 by the malfunction detection part 65. However, it is also possible to obtain the effect of the present invention in a case these features are not included.

Moreover, the present embodiment includes a feature to identify the ground fault place by the ground fault place identifying part 51. However, it is also able to obtain the effect of the present invention in a case this feature is not included.

Moreover, the present embodiment includes a feature to determine the ground fault reference voltage to detect the ground fault by the ground fault reference voltage determination part 62. However, it is also able to obtain the effect of the present invention in a case this feature is not included.

Moreover, the present embodiment includes a band-pass filter in the ground fault signal detection circuit 53. However, it is also able to obtain the effect of the present invention in a case the band-pass filter is not provided.

Moreover, in the present embodiment, processing to determine a frequency where the output of the ground fault signal detection circuit 53 is maximum at the intermediate portion of the transmission frequency band of the filter of the band-pass by sweeping the frequency of the detection signals, as the detection frequency by the detection frequency determination part 61. However, the detection frequency may be determined by a designed value of the band-pass filter without executing this processing.

Moreover, in the present embodiment, the ground fault detecting device 10 which detects the ground fault of the ungrounded circuit 70 installed in the electric vehicle 1 has been show. However, it is able to apply the present invention also to a ground fault detecting device which detects ground fault of an ungrounded circuit installed in vehicles other than electric vehicles or housings other than vehicles.

What is claimed is:

1. A ground fault detecting device of an ungrounded circuit which detects ground fault of the ungrounded circuit having a direct-current power supply and arranged in a vehicle electrically insulated from a ground potential portion of a vehicle body, the ground fault detecting device of the ungrounded circuit comprising:
    a detection signal generator configured to output detection signals in which an output voltage changes at a predetermined detection frequency;
    a first amplifier connected to a positive side output part of the direct-current power supply via a first junction circuit in which a capacitor and a resistance are connected in parallel, and configured to superimpose the detection signals to the positive side output part via the first junction circuit, and to output voltage according to voltage of the positive side output part based on voltage which is input via the first junction circuit;
    a second amplifier connected to a negative side output part of the direct-current power supply via a second junction circuit in which a capacitor and a resistance are connected in parallel, and configured to superimpose the detection signals to the negative side output part via the second junction circuit, and to output voltage according to voltage of the negative side output part based on voltage which is input via the second junction circuit;
    a ground fault detection part configured to detect ground fault of the ungrounded circuit based on a fluctuation range between voltage of the positive side output part and voltage of the negative side output part when the detection signals are superimposed on the positive side output part and the negative side output part of the direct-current power supply by the first amplifier and the second amplifier; and
    a first power supply voltage detection part configured to detect output voltage of the direct-current power supply based on a difference of output voltage of the first amplifier and the second amplifier.

2. The ground fault detecting device of the ungrounded circuit according to claim 1, wherein the first junction circuit and the second junction circuit are configured by connecting a plurality of number of unit junction circuits in series, each of the unit junction circuits having a capacitor and a resistance connected in parallel.

3. The ground fault detecting device of the ungrounded circuit according to claim 1, comprising,
    a second power supply voltage detection part configured to detect output voltage of the direct-current power supply based on a difference between voltage of the positive side output part and voltage of the negative side output part of the direct-current power supply, and
    a malfunction detection part configured to detect malfunction of the ground fault detecting device by comparing output voltage of the direct-current power supply detected by the first power supply voltage detection part and output voltage of the direct-current power supply detected by the second power supply voltage detection part.

4. The ground fault detecting device of the ungrounded circuit according to claim 1, comprising a ground fault place identifying part configured to identify a place of the ground fault of the ungrounded circuit based on output voltage of the first amplifier and the second amplifier.

5. The ground fault detecting device of the ungrounded circuit according to claim 1, comprising,
    a ground fault reference voltage determination part configured to situate a state of superimposing the detection signals to the positive side output part of the direct-current power supply from the first amplifier and superimposing direct-current voltage to the negative side output part of the direct-current power supply from the second amplifier, or a state of superimposing the detection signals to the negative side output part of the direct-current power supply from the second amplifier and superimposing direct-current voltage to the positive side output part of the direct-current power supply from the first amplifier, configured to measure a fluctuation range of voltage of the positive side output part and voltage of the negative side output part of the direct-current power supply, and configured to determine a ground fault reference voltage based on the fluctuation range, wherein the ground fault detection part is configured to detect existence or non-existence of ground fault of the ungrounded circuit by comparing the ground fault reference voltage and a measured voltage according to the voltage fluctuation range of the positive side output part and the voltage fluctuation range of the negative side output part, when the detection signals are superimposed on the positive side output part and the negative side output part of the direct-current power supply by the first amplifier and the second amplifier.

6. The ground fault detecting device of the ungrounded circuit according to claim 1, comprising,
  a band-pass filter configured to pass only signals having a frequency within a predetermined frequency band including the detection frequency among signals superimposed on output voltage of the direct-current power supply, and to input them to the ground fault detection part,
  wherein the ground fault detection part is configured to measure fluctuation range of the positive side output part and the negative side output part of the direct-current power supply from output voltage of the band-pass filter.

7. The ground fault detecting device of the ungrounded circuit according to claim 6, comprising,
  a detection frequency determination part configured to determine as the detection frequency, a frequency in which amplitude of voltage output to the ground fault detection part from the band-pass filter is maximum in a middle portion of the predetermined frequency band, by changing the frequency of the detection signals while measuring amplitude of voltage input to the ground fault detection part from the band-pass filter.

8. A vehicle comprising the ground fault detecting device of the ungrounded circuit of claim 1.

* * * * *